US009214951B1

(12) United States Patent
Lin (10) Patent No.: US 9,214,951 B1
(45) Date of Patent: Dec. 15, 2015

(54) SELF-CALIBRATING VCO-BASED ANALOG-TO-DIGITAL CONVERTER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/291,441

(22) Filed: May 30, 2014

(51) Int. Cl.
*H03M 1/10* (2006.01)
*H03M 1/12* (2006.01)

(52) U.S. Cl.
CPC .............. *H03M 1/1019* (2013.01); *H03M 1/10* (2013.01); *H03M 1/1009* (2013.01); *H03M 1/1235* (2013.01)

(58) Field of Classification Search
CPC ... H03M 1/10; H03M 1/1009; H03M 1/1235; H03M 1/1019
USPC .................................................. 341/120, 155
See application file for complete search history.

(56) References Cited

U.S. PATENT DOCUMENTS

| 5,361,067 | A | * | 11/1994 | Pinckley | 341/120 |
| 7,482,956 | B2 | * | 1/2009 | Huang et al. | 341/120 |
| 8,736,470 | B2 | * | 5/2014 | Oshima et al. | 341/120 |
| 9,041,569 | B2 | * | 5/2015 | Zhou et al. | 341/118 |

OTHER PUBLICATIONS

Taylor, et al.: "A Mostly-Digital Variable-Rate Continuous-Time Delta-Sigma Modulator ADC"; IEEE Journal of Solid-State Circuits, vol. 45, No. 12, Dec. 2010; pp. 2634-2646.
Taylor, et al.: "A Reconfigurable Mostly-Digital Delta-Sigma ADC with a Worse-Case FOM of 160dB"; IEEE Journal of Solid-State Circuits, vol. 48, No. 4, Apr. 2013; pp. 983-995.

* cited by examiner

*Primary Examiner* — Brian Young
(74) *Attorney, Agent, or Firm* — McClure, Qualey & Rodack, LLP (57) ABSTRACT

A circuit includes an input dispatch unit for receiving an input signal and a calibration signal and outputting N dispatched signals in accordance with a selection signal. The circuit also includes N analog-to-digital converter (ADC) units for receiving the N dispatched signals, N control signals, and N mapping tables and outputting N raw data, and N refined data, respectively. An output dispatch unit receives the N refined data and outputting an output data in accordance with the selection signal, and a calibration controller receives the N raw data and outputting the selection signal, the N control signals, the N mapping tables, and a digital code. A DAC (digital-to-analog converter) receives the digital code and outputting the calibration signal, wherein one of the dispatched signals, as specified by the selection signal is from the calibration signal while the other dispatched signals are from the input signal.

9 Claims, 6 Drawing Sheets

SELF-CALIBRATING VCO-BASED ANALOG-TO-DIGITAL CONVERTER AND METHOD THEREOF

BACKGROUND OF THE INVENTION

1. Field of the Invention

The present invention relates to ADC (analog-to-digital converter).

2. Description of Related Art

Persons of ordinary skill in the art will understand terms and basic concepts related to microelectronics that are used in this disclosure, such as PMOS (p-channel metal-oxide semiconductor) transistor, "source degeneration," "voltage," "current," "oscillation," "voltage-controlled oscillator," "ring oscillator," "frequency," "clock," "phase," "analog-to-digital converter," and "digital-to-analog converter." Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

Figure 1:
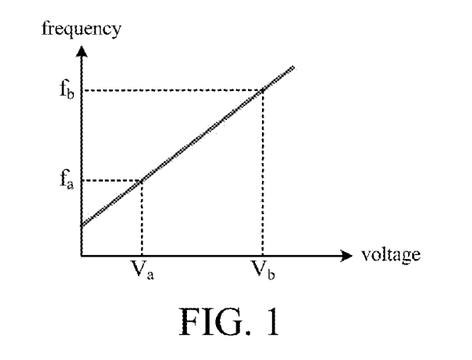
FIG. 1 shows a transfer characteristic of a voltage-controller oscillator (VCO).

A voltage-controlled oscillator (VCO) receives a voltage and outputs an oscillation signal, whose frequency (of oscillation) is determined by the voltage. An ideal transfer characteristic of a VCO is depicted in FIG. 1. As shown, the frequency (of oscillation) increases linearly as the voltage increases; when the voltage is Va, the frequency is fa; when the voltage is Vb, the frequency is fb. If the frequency of the oscillation signal can be detected, then the voltage can be inferred and thus detected. Sometimes, it is more convenient to detect the phase, instead of directly detecting the frequency, of the oscillation signal; in this case, the frequency can be indirectly detected by first detecting the phase and then performing a time derivative on the phase. As long as the frequency is detected and represented by a digital word, then the digital word is a digital representation of the voltage. In this manner, a VCO can be used to embody a digital-to-analog converter (ADC).

Figure 2:
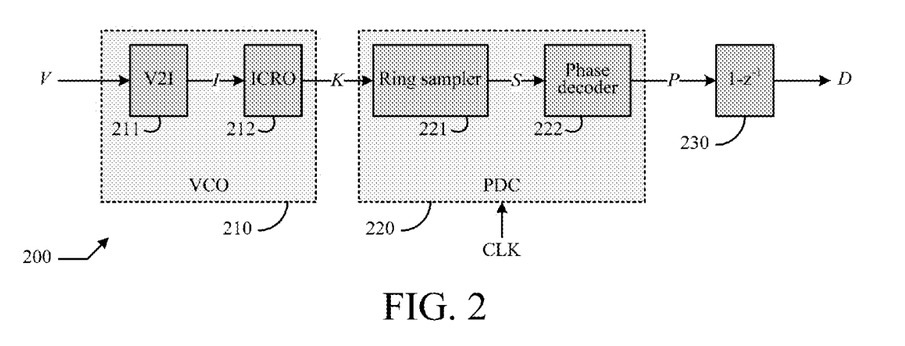
FIG. 2 shows a functional block diagram of a prior art VCO-based analog-to-digital converter (ADC).

As depicted in FIG. 2, a VCO based ADC 200 comprises: a VCO 210 for receiving a voltage V and outputs an oscillation signal K; a phase-to-digital converter (PDC) 220 for receiving the oscillation signal K and outputting a phase sample P representing a phase of the oscillation signal K in accordance with a timing provided by a clock CLK; and a derivative operator ($1-z-1$) 230 for receiving the phase sample P and outputting a digital output D. In an embodiment, VCO 210 comprises: a voltage-to-current converter (V2I) 211 for converting the voltage V into a current I, and a current-controlled ring oscillator (ICRO) 212 for generating the oscillation signal K in accordance with the current I. Phase-to-digital converter (PDC) 220 comprises: a ring sampler 221 for outputting a digital sample S by sampling the oscillation signal K using the clock CLK, and a phase decoder 222 for decoding the digital sample S into the phase sample P. The frequency of the oscillation signal K depends on the voltage V, as mentioned earlier; the phase of the oscillation signal K is detected and represented by the phase sample P; the digital output D, which is a time-derivative of the phase sample P, represents the frequency of the oscillation signal K (because the frequency is a time derivative of the phase) and thus indirectly represents the voltage V. Detailed embodiments of V2I 211, ICRO 212, ring sampler 221, and phase decoder 222 can be found in the following two papers authored by G. Taylor, I. Galton: (1) "A Mostly-Digital Variable-Rate Continuous-Time Delta-Sigma Modulator ACD," IEEE Journal of Solid-State Circuits, vol. 45, no. 12, pp. 2634-2646, December 2010; and (2) "A Reconfigurable Mostly-Digital Delta-Sigma ADC with a Worst-case FOM of 160 dB," IEEE Journal of Solid-State Circuits, vol. 48, no. 4, pp. 983-995, February 2013.

An issue with ADC 200 is, in practice, the transfer characteristics of VCO 210 is not perfectly linear; that is, the frequency of the oscillation signal K does not change linearly with the voltage V. In this case, the digital output D does not accurately represent the voltage V, unless a calibration is performed. Although efforts have been made by G. Taylor and I. Galton to achieve accurate analog-to-digital conversion by calibration, the calibration scheme is cumbersome and takes a long time to finish.

BRIEF SUMMARY OF THIS INVENTION

An objective of the present invention is to perform an accurate analog-to-digital conversion based on voltage-controlled oscillator using a self-calibration scheme. Another objective of this present invention is to efficiently calibrate a voltage-controller oscillator based analog-to-digital converter.

In an embodiment, a circuit comprises: an input dispatch unit for receiving an input signal and a calibration signal and outputting N dispatched signals in accordance with a selection signal, where N is an integer greater than two; N analog-to-digital converter (ADC) units for receiving the N dispatched signals, N control signals, and N mapping tables and outputting N raw data, and N refined data, respectively; an output dispatch unit for receiving the N refined data and outputting an output data in accordance with the selection signal; a calibration controller for receiving the N raw data and outputting the selection signal, the N control signals, the N mapping tables, and a digital code; and a DAC (digital-to-analog converter) for receiving the digital code and outputting the calibration signal, wherein the selection signal has N possible values, and one of the N dispatched signals as specified by the selection signal is from the calibration signal while the other N−1 dispatched signals are from the input signal. In an embodiment, the selection signal cycles through the N possible values. In an embodiment, each of the N ADC units comprises: a voltage-controlled oscillator for receiving the respective dispatched signal and outputting an oscillation signal in accordance with the respective control signal; a phase-to-digital converter for receiving the oscillation signal and outputting a digitized phase signal; a derivative operator for receiving the digitized phase signal and outputting the respective raw data; and a nonlinearity correction unit for receiving the respective raw data and outputting the respective refined data based on the respective mapping table. In an embodiment, the respective mapping table is updated by the calibration controller per a result of the respective raw data when the respective dispatched signal is dispatched from the calibration signal. In an embodiment, a least mean square error algorithm is used to update the respective mapping table.

In an embodiment, a method comprises: receiving an input signal; generating a calibration signal using a digital-to-analog converter; incorporating N analog-to-digital converter (ADC) units, each comprising a voltage-controlled oscillator for receiving either the input signal or the calibration signal and outputting an oscillation signal in accordance with a control signal, a phase-to-digital converter for receiving the oscillation signal and outputting a digitized phase signal, a derivative operator for receiving the digitized phase signal and outputting a raw data, and a nonlinearity correction unit for receiving the raw data and outputting a refined data based on a mapping table; selecting one of the N ADC units for calibration purpose; dispatching the calibration signal to the selected ADC unit for performing analog-to-digital conversion on the calibration signal and collecting its raw data; dispatching the input signal to the other N−1 ADC units for performing analog-to-digital conversion on the input signal and collecting their refined data; updating the control signal and the mapping table associated with the selected ADC unit that is performing analog-to-digital conversion on the calibration signal, based on the raw data collected from the selected ADC unit; summing the refined data collected from the other N−1 ADC units to generate an output data; and selecting another ADC unit and repeat the dispatching, the updating, and the summing. In an embodiment, a least mean square error algorithm is used to update the mapping table. In an embodiment, each of the N ADC units comprises: a voltage-controller oscillator for receiving either the calibration signal or the input signal and outputting an oscillation signal in accordance with the associated control signal; a phase-to-digital converter for receiving the oscillation signal and outputting a digitized phase signal; a derivative operator for receiving the digitized phase signal and outputting the raw data; and a nonlinearity correction unit for receiving the raw data and outputting the refined data in accordance with the associated mapping table.

In an embodiment, a method comprises: dispatching a calibration signal to an analog-to-digital converter unit for performing analog-to-conversion on the calibration signal to obtain a raw data; setting the calibration signal to a first level and performing an averaging on the raw data to obtain a first mean value; setting the calibration signal to a second level and performing an averaging on the raw data to obtain a second mean value; setting the calibration signal to a third level and performing an averaging on the raw data to obtain a third mean value; setting the calibration signal to a fourth level and performing an averaging on the raw data to obtain a fourth mean value; determining a first, a second, a third, and a fourth ideal value for the first, the second, the third, and the fourth mean value, respectively, for a hypothetical case where the analog-to-digital conversion is ideal; applying a least mean square error algorithm to obtain a set of coefficients for mapping the first, the second, the third, and the fourth mean value into the first, the second, the third, and the fourth ideal value, respectively, to minimize a mean square error.

DETAILED DESCRIPTION OF THE DRAWINGS

DETAILED DESCRIPTION OF THIS INVENTION

The present invention relates to analog-to-digital converters. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 3:
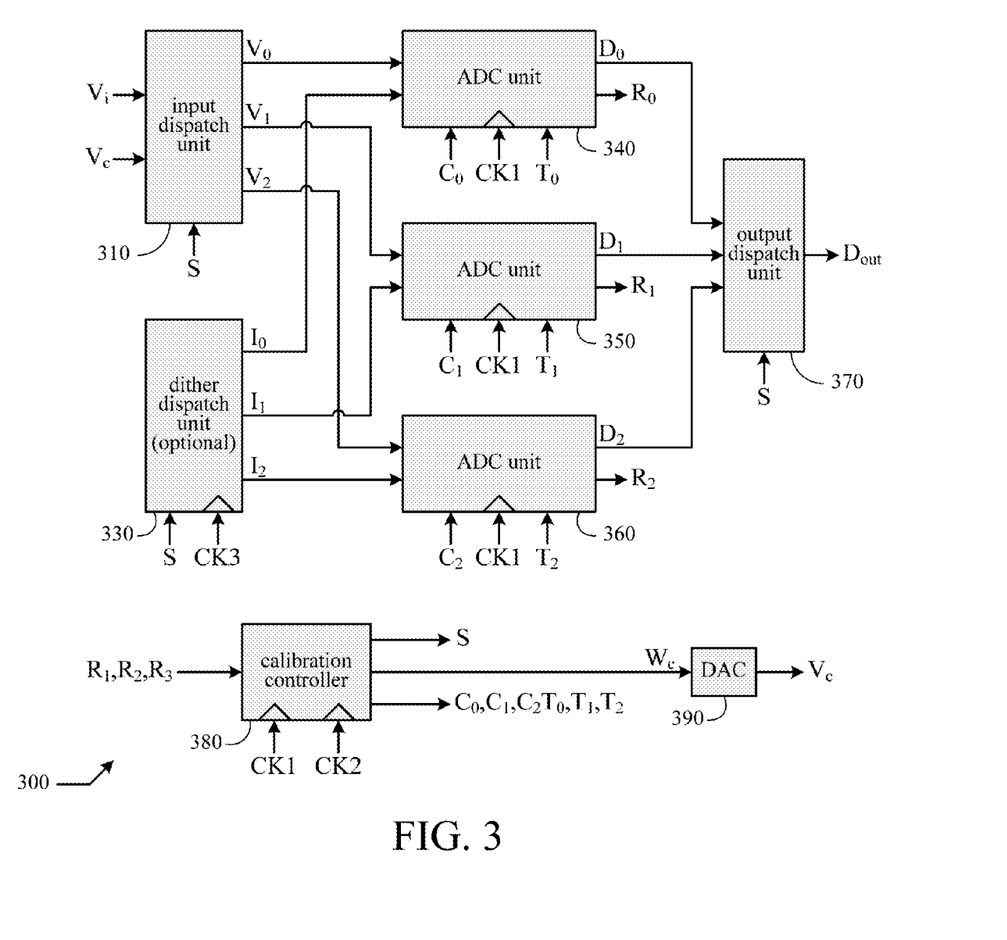
FIG. 3 shows a functional block diagram of a VCO-based ADC in accordance with an embodiment of this present invention.

As shown in FIG. 3, an ADC 300 in accordance with an embodiment of the present invention comprises: an input dispatch unit 310 for receiving an input signal Vi and a calibration signal Vc and outputting three dispatched signals V0, V1, and V2 in accordance with a selection signal S; a dither dispatch unit 330 for outputting three dither signals I0, I1, and I2 in accordance with the selection signal S; three ADC units 340, 350, and 360 for receiving the three dispatched signals V0, V1, and V2, the three dither signals I0, I1, and I2, and three control signals C0, C1, and C2, for outputting three raw data R0, R1, and R2, along with three refined data D0, D1, and D2, that are derived based on three mapping tables T0, T1, and T2, respectively; an output dispatch unit 370 for receiving the three refined data D0, D1, and D2 and outputting an output data Dout in accordance with the selection signal S; a calibration controller 380 for receiving the three raw data R0, R1, and R2 and outputting the selection signal S, the three control signals C0, C1, and C2, and the three mapping tables T0, T1, and T2, and a digital code Wc; and a DAC (digital-to-analog converter) 390 for receiving the digital code Wc and outputting the calibration signal Vc. ADC units 340, 350, and 360 are all VCO-based ADC, just like ADC 200 of FIG. 2.

In terms of timing, the three ADC units 340, 350, and 360 work in accordance with a first clock CK1; the calibration controller 380 works in accordance with the first clock CK1 and a second clock CK2; and the dither dispatch unit 330 works in accordance with a third clock CK3. By way of example but not limitation, in an embodiment, a frequency of the first clock CK1 is 1.28 GHz; a frequency of the second clock CK2 is 5 MHz; a frequency of the third clock CK3 is 160 MHz.

For ADC 300, Vi is the input signal that needs to be converted (to digital data), while Vc is a pre-known calibration signal that is self-generated for calibration purpose. The three ADC units (340, 350, and 360) perform analog-to-digital conversion on either Vi or Vc. At a given moment, the input dispatch unit 310 is dispatching the input signal Vi to two of the three ADC units while dispatching the calibration signal Vc to the remaining one of the three ADC units. The three raw data R0, R1, and R2 are a direct result of the analog-to-digital conversion of the three ADC units and are subject to errors due to nonlinear transfer characteristics of the VCO therein, as mentioned earlier. The three mapping tables T0, T1, and T2 are intended to correct the nonlinear transfer characteristics and used for the three ADC units to generate the three refined data D0, D1, and D2, respectively. However, only two of the three refined data (D0, D1, and D2) are a result of analog-to-digital conversion on the input signal Vi (the other one is a result of analog-to-digital conversion on the calibration signal Vc.) The output dispatch unit 370 generates the output data Dout based on two of the three refined data that correspond to the two ADC units that are performing analog-to-digital conversion on the input signal Vi. The remaining ADC unit is said to be under calibration; it performs analog-to-digital conversion on the calibration signal Vc to generate a corresponding raw data (R0, R1, or R2) that is used to update its corresponding control signal (C0, C1, or C2) and mapping table (T0, T1, or T2). The calibration controller 380 issues the selection signal S to the input dispatch unit IC 310 to effectively select one of the three ADC units (340, 350, and 360) for calibration and allows the other two ADC units to perform analog-to-digital conversion on the input signal Vi. The calibration controller 380 also issues the selection signal S to the output dispatch unit 379 to effectively select the refined outputs from the two ADC units that perform analog-to-digital conversion on the input signal Vi. In addition, the calibration controller 380 issues the selection signal S to the dither dispatch unit 330 to dispatch dither signals to the two ADC units that perform analog-to-digital conversion on the input signal Vi. The calibration controller 380 processes the one of the three raw data (R0, R1, or R2) that is from the ADC unit that is under calibration, and updates the corresponding control signal (C0, C1, or C2) mapping table (T0, T1, or T2). Furthermore, the calibration controller 380 issues the digital code Wc to DAC 390 to generate the calibration signal Vc in accordance with a calibration procedure.

Dither signals (I0, I1, and I2) are used to suppress spurious tones that may otherwise emerge and degrade performance of analog-to-digital conversion; they are optional but recommended. In other words, ADC 300 will still work, albeit probably with a worse performance, if the dither dispatch unit 330 is removed and the three dither signals I0, I1, and I2 are absent (or zero).

In an embodiment, the selection signal S has three possible values: 0, 1, and 2. When S is 0, ADC unit 340 is under calibration; when S is 1, ADC unit 350 is under calibration; and when S is 2, ADC unit 360 is under calibration. In an embodiment, the input dispatch unit 310 performs a function that can be behaviorally described by the following Verilog model:

always @($V_i$ or $V_c$ or S)
begin
case (S)
   0: $V_0=V_c$; $V_1=V_i$; $V_2=V_i$;
   1: $V_0=V_i$; $V_1=V_c$; $V_2=V_i$;
   2: $V_0=V_i$; $V_1=V_i$; $V_2=V_c$;
endcase
end That is, when S is 0, $V_c$ is assigned to $V_0$, while $V_i$ is assigned to both $V_1$ and $V_2$; when S is 1, $V_c$ is assigned to $V_1$, while $V_i$ is assigned to both $V_0$ and $V_2$; and when S is 2, $V_c$ is assigned to $V_2$, while Vi is assigned to both V0 and V1.

In an embodiment, the output dispatch unit 370 performs a function that can be behaviorally described by the following Verilog model:

always @($D_0$ or $D_1$ or $D_2$ or S)
begin
case (S)
   0: $D_{out}=D_1+D_2$;
   1: $D_{out}=D_0+D_2$;
   2: $D_{out}=D_0+D_1$;
endcase
end That is, when S is 0, $D_{out}$ is a sum of $D_1$ and $D_2$; when S is 1, $D_{out}$ is a sum of D0 and D2; and when S is 2, Dout is a sum of D0 and D1.

In an embodiment, the dither dispatch unit 330 comprises a dither signal generator that generates a first pseudo-random signal $I_{d1}$ and a second pseudo-random signal $I_{d2}$, where $I_{d2}$ is an inversion of $I_{d1}$, that are dispatched in a manner that can be behaviorally described by the following Verilog model:

always @($I_{d1}$ or $I_{d2}$ or S)
begin
case (S)
   0: $I_0=0$; $I_1=I_{d1}$; $I_2=I_{d2}$;
   1: $I_0=I_{d2}$; $I_1=0$; $I_2=I_{d1}$;
   2: $I_0=I_{d1}$; $I_{d1}=I_{d2}$; $I_2=0$;
endcase
end That is, when S is 0, $I_0$ is zero, $I_{d1}$ is assigned to $I_1$, and the inversion Id2 is assigned to I2; when S is 1, I1 is zero, Id1 is assigned to I2, and the inversion Id2 is assigned to I0; and when S is 2, I2 is zero, Id1 is assigned to I0, and the inversion Id2 is assigned to I1. In an embodiment, Id1 and Id2 are current-mode signals that are generated by current-mode DAC (digital-to-analog converters) working in accordance with the third clock CK3. A pseudo-random signal can be generated by, for instance, a linear feedback shift register; this is well known to persons of ordinary skill in the part and thus not described in detail here.

In a preferred embodiment, differential signaling is employed for the input signal Vi, the calibration signal Vc, the three dispatched signal V0, V1, and V2, and the three dither signal I0, I1, and I2. A differential signal comprises a first end subscripted with "+" and a second end subscripted with "−." For instance, when Vi is referred, it must be understood that it comprises a first end Vi+, and a second end Vi−. The same thing applies to Vc, V0, V1, V2, I0, I1, and I2; that is, Vc (V0, V1, V2, I0, I1, I2) comprises a first end Vc+ (V0+, V1+, V2+, I0+, I1+, I2+) and a second end Vc− (V0−, V1−, V2−, I0−, I1−, I2−). In addition, each of the three raw data R0, R1, and R2 comprises a first part subscripted with "+" and a second part subscripted with "−." That is, R0 (R1, R2) comprises R0+ (R1+, R2+) and R0− (R1−, R2−). Also, each of the three mapping tables T1, T2, and T2 comprises a first sub-table subscripted with "+" and a second sub-table subscripted with "−"; that is, T0 (T1, T2) comprises T0+ (T1+, T2+) and T0− (T1−, T2−).

Figure 4:
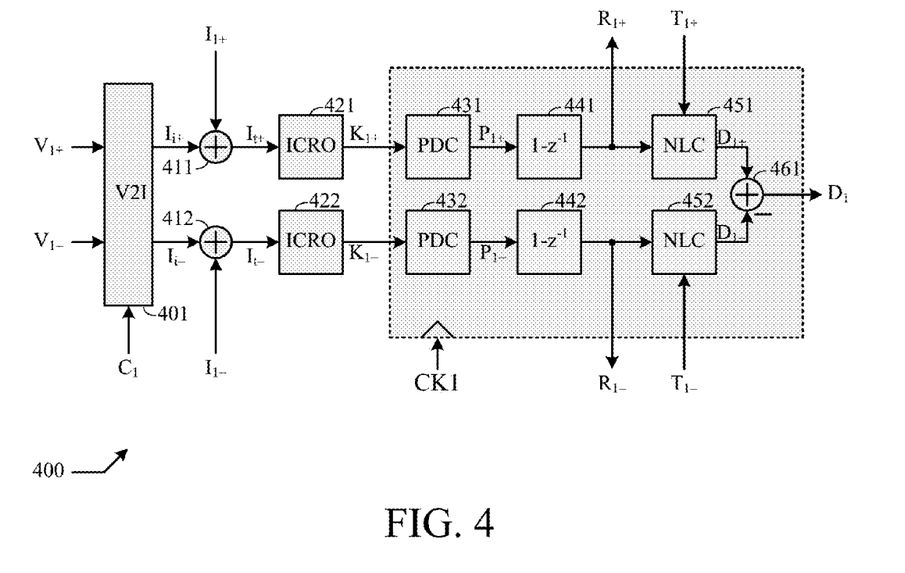
FIG. 4 shows an ADC unit suitable for the VCO-based ADC of FIG. 3.

A functional block diagram of an ADC unit 400 suitable for embodying ADC units 340, 350, and 360 of FIG. 3 is depicted in FIG. 4. Here, the signaling that applies to ADC unit 350, which receives V1, I1, C1 and T1 and outputs D1 and R1, as shown in FIG. 3, is used as example; however, it should be understood that the same embodiment can be applied to ADC unit 340 and 360, except that the input/output signals are different. Also, differential signaling is used, and therefore a signal comprises a first end subscripted with "+" and a second end subscripted with "−," as explained earlier. ADC unit 400 comprises: a voltage-to-digital converter (V2I) 401 for converting the dispatched signal V1 into an intermediate current signal Ii in accordance with the control signal C1; a pair of summing circuits 411 and 412 for summing the intermediate current signal Ii and the dither signal I1 into a total current It; a pair of current-controlled ring oscillator (ICRO) 421 and 422 for receiving the total current It and outputting an oscillation signal K1; a pair of phase-to-digital converter (PDC) 431 and 432 for receiving the oscillation signal K1 and outputting a digitized phase signal P1; a pair of derivative operators ($1$-$z$-$1$) 441 and 442 for receiving the digitized phase signal P1 and outputting the raw data R1; a pair of nonlinearity correction (NLC) units 451 and 452 for receiving the raw data R1 and outputting the refined data D1 in accordance with the mapping table T1. As explained before, differential signaling is used, so the refined data D1 comprises a plus end D1+ and a minus end D1−. To convert the differential signaling into single-ended signaling, a summing unit 461 for subtracting the minus end D1− from the plus end D1+ is needed. Note that the first clock CK1 is used for provide timing.

Figure 5:
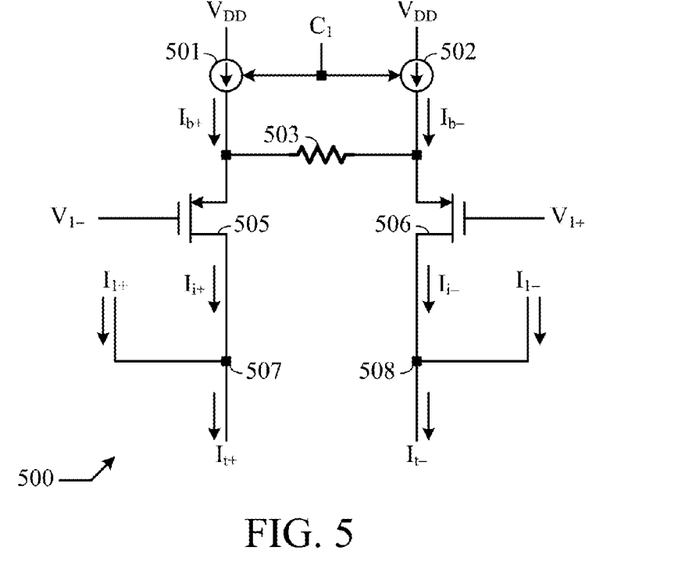
FIG. 5 shows a schematic diagram of a V2I (voltage-to-current converter) suitable for the ADC unit of FIG. 4.

A schematic diagram of a V2I 500 suitable for embodying V2I 401 of FIG. 4 is depicted in FIG. 5. V2I 500 comprises: a pair of current sources 501 and 502 controlled by the control signal C1 for outputting a bias current Ib; a PMOS (p-channel metal oxide semiconductor) differential pair transistors 505 and 506 for receiving the bias current Ib and the dispatched signal V1 and outputting the intermediate current Ii to circuit nodes 507 and 508. At the same time, the dither signal I1 (comprising I1+ and I1−) is also injected to circuit nodes 507 and 508, resulting in the total current It. Note that the summing circuits 411 and 412 of FIG. 4 are implicitly embodied by injecting both I1 and Ii to circuit nodes 507 and 508. V2I 500 further comprises a resistor 503 to provide a source degeneration for the PMOS differential pair transistors 505 and 506. In an embodiment, the bias current Ib increases when a value of the control signal C1 increases, and decreases when the value of the control signal C1 decreases. Note that VDD denotes a power supply node, as commonly practiced by persons of ordinary skill in the art. In an embodiment, the control signal C1 is a 8-bit word, and the current sources 501 and 502 are both 8-bit current-mode digital-to-analog converters.

Reference is again made to FIG. 4. PDC 431 and 432 can both be embodied by a ring sampler followed by a phase decoder, just like PDC 220 of FIG. 2. Detailed information about implementation of ICRO (421, 422), ring sampler, and phase decoder can be found in the two aforementioned papers authored by G. Taylor, I. Galton and thus not described here.

In an embodiment, T1+ and T1− are sub-tables that map R1+ and R1− into D1+ and D1−, respectively. In an embodiment: ICRO 421 and 422 are both 28-phase ring oscillators; P1+ and P1−, which represent digitized phases of the oscillation signal K1 (that comprises K1+ and K1−), respectively, are integers in the range $\{0, 1, 2, 3, \ldots, 27\}$; R1+ and R1− are integers in the range $\{-14, -13, -12, \ldots, 11, 12, 13\}$; T1+ is a 28-entry table that tabulates each of the 28 possible values of R1+ and corresponding values of D1+; and T1− is a 28-entry table that tabulates each of the 28 possible values of R1− and corresponding values of D1−. NLC 451 and 452 map R1+ and R1− into D1+ and D1− using table lookup based on T1+ and T1−, respectively.

Figure 6:
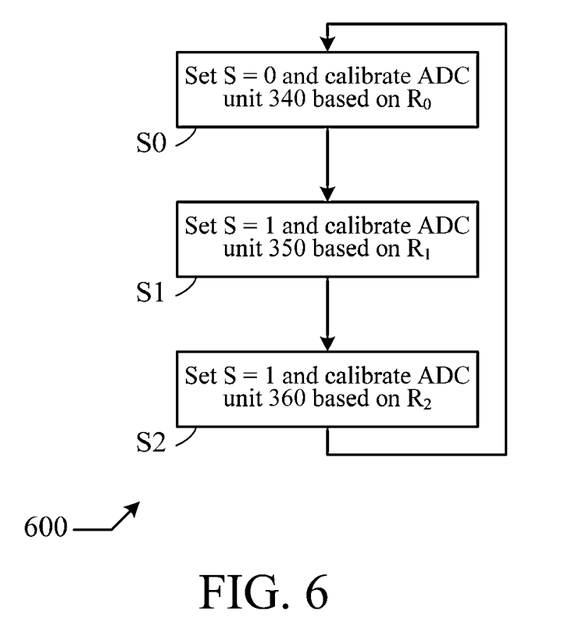
FIG. 6 shows a flow diagram suitable for embodying the calibration controller of the VCO-based ADC of FIG. 3.

Referring to FIG. 3, in an embodiment, calibration controller 380 comprises a finite state machine, working in accordance with the second clock CK2, that cycles through three states S0, S1, and S2 for calibrating ADC units 340, 350, and 360, respectively, as demonstrated by a flow chart 600 shown in FIG. 6. In state S0, S is set to 0, and ADC unit 340 is calibrated based on R0; in state S1, S is set to 1, and ADC unit 350 is calibrated based on R1; and in state S2, S is set to 2, and ADC unit 360 is calibrated based on R2. A scheme for calibrating ADC unit 350 (when S is set to 1) will be given as an example; it should be understood that the same scheme is applied for calibrating ADC units 340 and 360 as well by changing the signaling, i.e. changing S to 0 and 2, changing V1 to V0 and V2, changing C1 to C0 and C2, changing R1 to R0 and R2, changing T1 to T0 and T2, changing D1 to D0 and D2, and changing T1 to T0 and T2, respectively.

When calibrating ADC unit 350, there are two calibrations that are needed: the control signal C1, and the mapping table T1.

The control signal C1 needs to be established so that a mean frequency of ICRO 421 and 422 (see FIG. 4) is approximately equal to a frequency of the first clock CK1. When the mean frequency of ICRO 421 and 422 is approximately equal to the frequency of the first clock CK1, a mean value of an average of R1+ and R1− will be approximately zero. In an embodiment, the following algorithm is used to adapt C1: calculate a mean value of (R1++R1−)/2 over 216 cycles of the first clock CK1; increment a value of C1 to increase the bias current Ib (see FIG. 5) so as to raise the mean frequency of ICRO 421 and 422 if the mean value of (R1++R1−)/2 (over the 216 cycles of the first clock CK1) is negative, otherwise decrement the value of C1.

Adaptation of the mapping table T1 is described as follows. As mentioned earlier, a VCO-based ADC such as ADC unit 350 of FIG. 3 (embodied by ADC unit 400 of FIG. 4 that uses V2I 401 along with ICRO 421 and 422 to implement a pair of VCO) suffers from performance degradation due to nonlinear transfer characteristics of the VCO. As a result, as linear change of V1 does not lead to a linear change of R1. To correct the nonlinearity, NLC 451 and 452 (see FIG. 4) are used to map R1 into D1 such that a linear change of V1 leads to an approximately linear change of D1. During calibration of ADC unit 350 (i.e. S is set to 1), V1 is set to a pre-known value, and the mapping tables T1+ and T1− must be adapted so that the resultant value of D1 is the same as what is expected from an ideal VCO that has linear transfer characteristics. In an embodiment, $T_{1+}$ and $T_{1-}$ are based on a 3rd order polynomial function that can be mathematically described by the following two equations:

$$D_{1+}(R_{1+}) = \beta_{0+} + \beta_{1+} R_{1+} + \beta_{2+} R_{1+}^2 + \beta_{3+} R_{1+}^3 \quad (1)$$

$$D_{1-}(R_{1-}) = \beta_{0-} + \beta_{1-} R_{1-} + \beta_{2-} R_{1-}^2 + \beta_{3-} R_{1-}^3 \quad (2)$$

Here, $\beta_{0+}, \beta_{1+}, \beta_{2+}, \beta_{3+}$ are the coefficients for the 3rd order polynomial function that the mapping table $T_{1+}$ uses for mapping $R_{1+}$ into $D_{1+}$; and $\beta_{0-}, \beta_{1-}, \beta_{2-}, \beta_{3-}$ are the coefficients for the 3rd order polynomial function that the mapping table $T_{1-}$ uses for mapping $R_{1-}$ into $D_{1-}$. The purpose of calibration is to find optimal values for $\beta_{0+}, \beta_{1+}, \beta_{2+}, \beta_{3+}, \beta_{0-}, \beta_{1-}, \beta_{2-}, \beta_{3-}$, such that the resultant value of $D_{1+}$ and $D_{1-}$ agree with what are expected from the pre-known values of $V_{1+}$ and $V_{1-}$, as if the VCO therein are ideal and perfectly linear. To find the four coefficients for a 3rd order polynomial, four distinct input values are needed. In an embodiment, the digital code $W_c$ (which the calibration controller 380 of FIG. 3 issues to establish the calibration signal $V_c$ that is dispatched to ADC unit 350 when the selection signal S is 1) has four distinct values $W_{c1}, W_{c2}, W_{c3},$ and $W_{c4}$, which correspond to four levels $V_{c1}, V_{c2}, V_{c3},$ and $V_{c4}$, respectively, of the calibration signal $V_c$ (which is dispatched to ADC unit 350 when S=1); the target values for $D_1$ are $D_{c1}, D_{c2}, D_{c3},$ and $D_{c4}$, respectively, for a hypothetical case where the VCO therein are ideal and perfectly linear. The coefficients ($\beta_{0+}, \beta_{1+}, \beta_{2+}, \beta_{3+}, \beta_{0-}, \beta_{1-}, \beta_{2-}, \beta_{3-}$) can be found using a least man squared method. In an embodiment, the calibration controller 380 uses an algorithm broken down by the following steps to update the coefficients:

Step 1: Set $W_c$ to $W_{c1}$ for $2^{16}$ clock cycles of CK1 and obtain $R_{c1+}$ and $R_{c1-}$ that are statistical means for $R_{1+}$ and $R_{1-}$, respectively, during this time span.

Step 2: Set $W_c$ to $W_{c2}$ for $2^{16}$ clock cycles of CK1 and obtain $R_{c2+}$ and $R_{c2-}$ that are statistical means for $R_{1+}$ and $R_{1-}$, respectively, during this time span.

Step 3: Set $W_c$ to $W_{c3}$ for $2^{16}$ clock cycles of CK1 and obtain $R_{c3+}$ and $R_{c3-}$ that are statistical means for $R_{1+}$ and $R_{1-}$, respectively, during this time span.

Step 4: Set $W_c$ to $W_{c4}$ for $2^{16}$ clock cycles of CK1 and obtain $R_{c4+}$ and $R_{c4-}$ that are statistical means for $R_{1+}$ and $R_{1-}$, respectively, during this time span.

Steps 5: Applying a least mean squared method to find coefficients that can map the statistical means for $R_1$ into the corresponding target values for $D_1$ by using the following formulas:

$$\begin{bmatrix} \beta_{3+} \\ \beta_{2+} \\ \beta_{1+} \\ \beta_{0+} \end{bmatrix} = \begin{bmatrix} R_{c1+}^3 & R_{c1+}^2 & R_{c1+} & 1 \\ R_{c2+}^3 & R_{c2+}^2 & R_{c2+} & 1 \\ R_{c3+}^3 & R_{c3+}^2 & R_{c3+} & 1 \\ R_{c4+}^3 & R_{c4+}^2 & R_{c4+} & 1 \end{bmatrix}^{-1} \begin{bmatrix} D_{c1+} \\ D_{c2+} \\ D_{c3+} \\ D_{c4+} \end{bmatrix} \quad (3)$$

$$\begin{bmatrix} \beta_{3-} \\ \beta_{2-} \\ \beta_{1-} \\ \beta_{0-} \end{bmatrix} = \begin{bmatrix} R_{c1-}^3 & R_{c1-}^2 & R_{c1-} & 1 \\ R_{c2-}^3 & R_{c2-}^2 & R_{c2-} & 1 \\ R_{c3-}^3 & R_{c3-}^2 & R_{c3-} & 1 \\ R_{c4-}^3 & R_{c4-}^2 & R_{c4-} & 1 \end{bmatrix}^{-1} \begin{bmatrix} D_{c1-} \\ D_{c2-} \\ D_{c3-} \\ D_{c4-} \end{bmatrix} \quad (4)$$

Using the coefficients obtained from (3) and (4), and applying the mappings described by (1) and (2), the four levels $V_{c1}$, $V_{c2}$, $V_{c3}$, and $V_{c4}$ of the calibration signal $V_c$ will result in the four target values $D_{c1}$, $D_{c2}$, $D_{c3}$, and $D_{c4}$, respectively, which is what's expected from an ideal, perfectly linear ADC. In this manner, ADC unit 350 is calibrated.

Using the above method, the coefficients can be found much faster than the method taught by the two aforementioned papers authored by G. Taylor and I. Galton, which use a pseudo-random calibration signal to perform calibration and thus need a much longer period for obtaining a reliable statistical average due to nature of randomness of the calibration signal.

Figure 7:
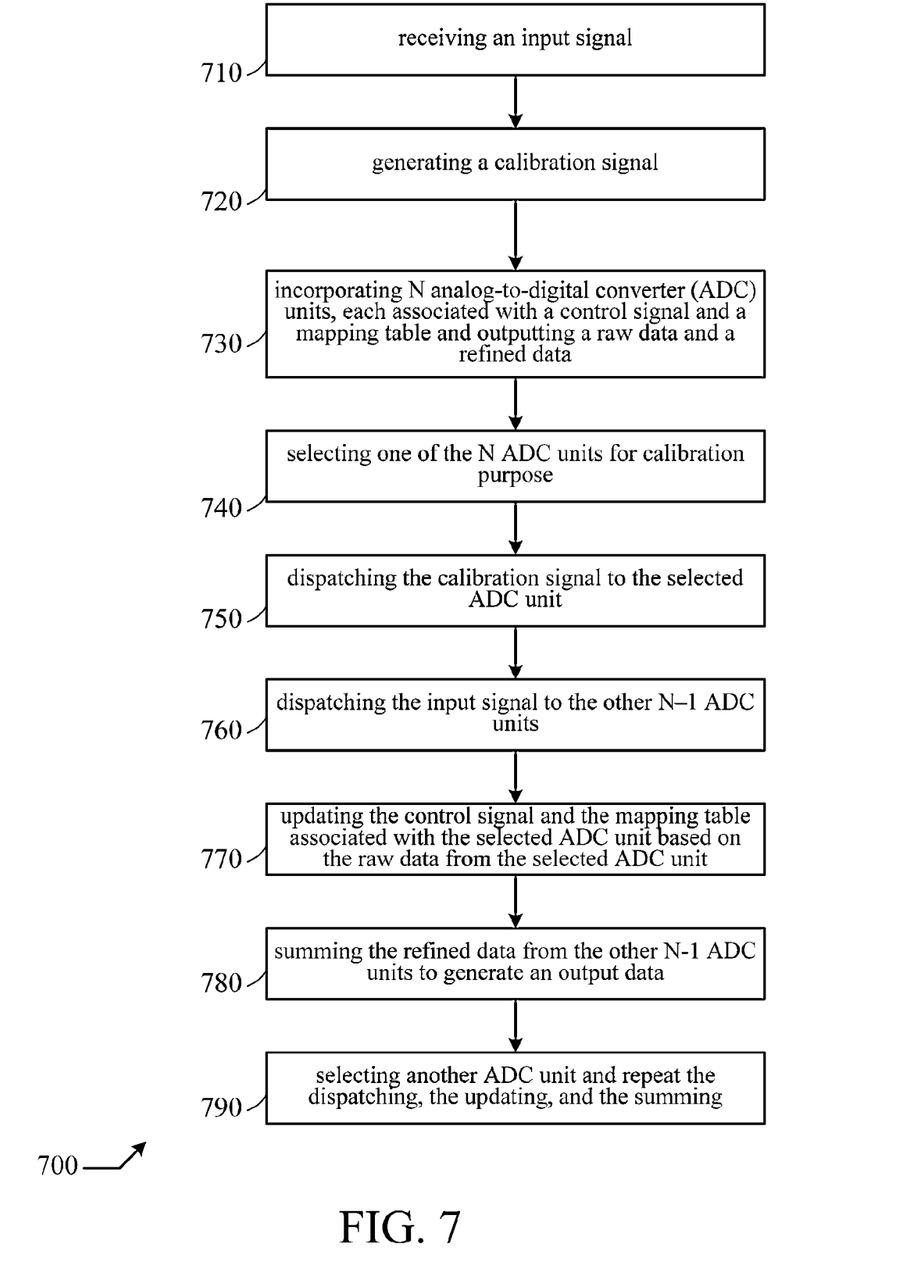
FIG. 7 shows a flow diagram of a method in accordance with an embodiment of the present invention.

As demonstrated by a flow chart 700 shown in FIG. 7, a method in accordance with an embodiment of the present invention comprises: step 710 for receiving an input signal; step 720 for generating a calibration signal using a digital-to-analog converter; step 730 for incorporating N (which is an integer greater than two) analog-to-digital converter (ADC) units, each comprising a voltage-controlled oscillator for receiving either the input signal or the calibration signal and outputting an oscillation signal in accordance with a control signal, a phase-to-digital converter for receiving the oscillation signal and outputting a digitized phase signal, a derivative operator for receiving the digitized phase signal and outputting a raw data, and a nonlinearity correction unit for receiving the raw data and outputting a refined data based on a mapping table; step 740 for selecting one of the N ADC units for calibration purpose; step 750 for dispatching the calibration signal to the selected ADC unit for performing analog-to-digital conversion on the calibration signal and collecting its raw data; step 760 for dispatching the input signal to the other N−1 ADC units for performing analog-to-digital conversion on the input signal and collecting their refined data; step 770 for updating the control signal and the mapping table associated with the selected ADC unit that is performing analog-to-digital conversion on the calibration signal, based on the raw data collected from the selected ADC unit; step 780 for summing the refined data collected from the other N−1 ADC units to generate an output data; and step 790 for selecting another ADC unit and repeat the dispatching, the updating, and the summing. In an embodiment, a least mean square error algorithm is used to update the mapping table.

Figure 8:
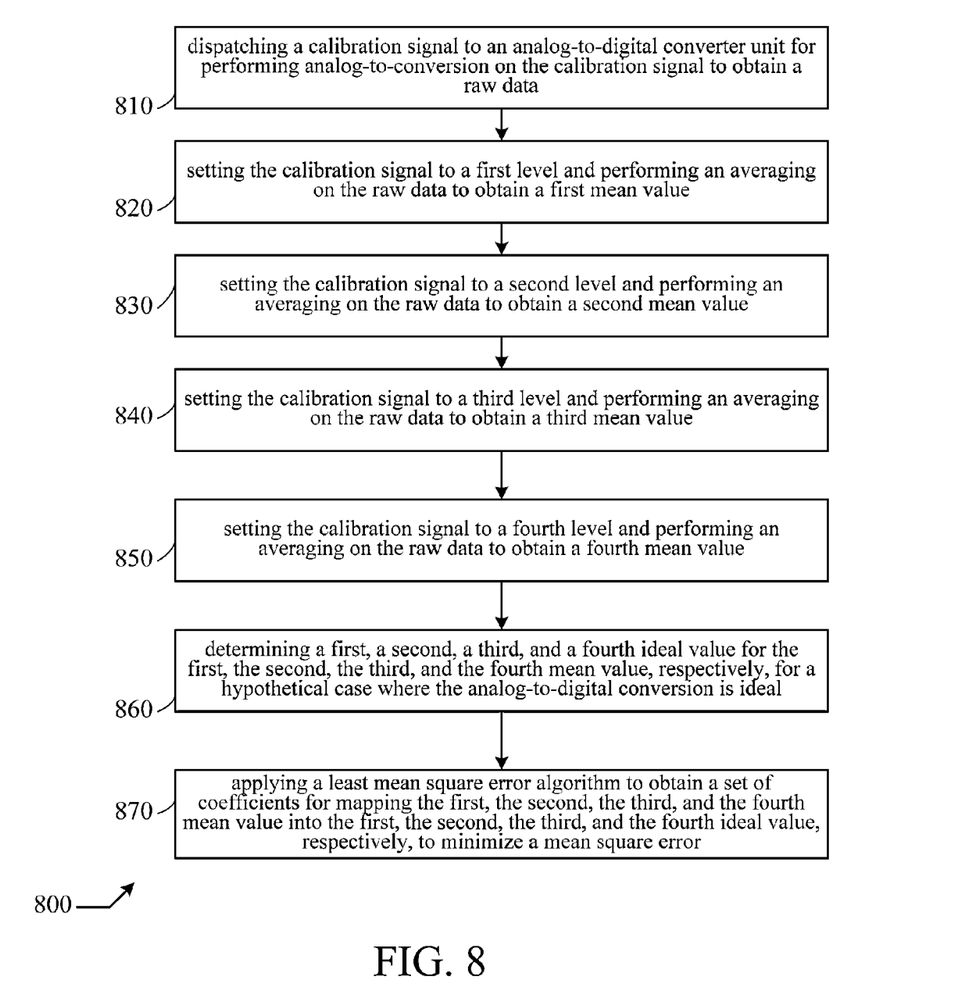
FIG. 8 shows a flow diagram of a method in accordance with an embodiment of the present invention.

As demonstrated by a flow chart 800 shown in FIG. 8, a method in accordance with an embodiment of the present invention comprises: step 810 for dispatching a calibration signal to an analog-to-digital converter unit for performing analog-to-conversion on the calibration signal to obtain a raw data; step 820 for setting the calibration signal to a first level and performing an averaging on the raw data to obtain a first mean value; step 830 for setting the calibration signal to a second level and performing an averaging on the raw data to obtain a second mean value; step 840 for setting the calibration signal to a third level and performing an averaging on the raw data to obtain a third mean value; step 850 for setting the calibration signal to a fourth level and performing an averaging on the raw data to obtain a fourth mean value; step 860 for determining a first, a second, a third, and a fourth ideal value for the first, the second, the third, and the fourth mean value, respectively, for a hypothetical case where the analog-to-digital conversion is ideal; step 870 for applying a least mean square error algorithm to obtain a set of coefficients for mapping the first, the second, the third, and the fourth mean value into the first, the second, the third, and the fourth ideal value, respectively, to minimize a mean square error.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
    an input dispatch unit for receiving an input signal and a calibration signal and outputting N dispatched signals in accordance with a selection signal, where N is an integer greater than two;
    N analog-to-digital converter (ADC) units for receiving the N dispatched signals, N control signals, and N mapping tables and outputting N raw data, and N refined data, respectively;
    an output dispatch unit for receiving the N refined data and outputting an output data in accordance with the selection signal;
    a calibration controller for receiving the N raw data and outputting the selection signal, the N control signals, the N mapping tables, and a digital code; and
    a DAC (digital-to-analog converter) for receiving the digital code and outputting the calibration signal, wherein the selection signal has N possible values, and one of the N dispatched signals as specified by the selection signal is from the calibration signal while the other N−1 dispatched signals are from the input signal.

2. The circuit of claim 1, wherein the selection signal cycles through the N possible values.

3. The circuit of claim 1, wherein each of the N ADC units comprises:
    a voltage-controlled oscillator for receiving the respective dispatched signal and outputting an oscillation signal in accordance with the respective control signal;
    a phase-to-digital converter for receiving the oscillation signal and outputting a digitized phase signal;
    a derivative operator for receiving the digitized phase signal and outputting the respective raw data; and
    a nonlinearity correction unit for receiving the respective raw data and outputting the respective refined data based on the respective mapping table.

4. The circuit of claim 3, wherein the respective mapping table is updated by the calibration controller per a result of the respective raw data when the respective dispatched signal is dispatched from the calibration signal.

5. The circuit of claim 4, wherein a least mean square error algorithm is used to update the respective mapping table.

6. A method comprising:
    receiving an input signal;
    generating a calibration signal using a digital-to-analog converter;
    incorporating N analog-to-digital converter (ADC) units, each associated with a control signal and a mapping table and outputting a raw data and a refined data;
    selecting one of the N ADC units for calibration purpose;

dispatching the calibration signal to the selected ADC unit for performing an analog-to-digital conversion on the calibration signal and dispatching the input signal to the other N−1 ADC units for performing an analog-to-digital conversion on the input signal;

updating the control signal and the mapping table associated with the selected ADC unit based the raw data from the selected ADC unit; and summing the refined data from the other N−1 ADC units to generate an output data; and selecting another ADC unit and repeat the dispatching, the updating, and the summing.

7. The method of claim 6, wherein a least mean square error algorithm is used for updating the mapping table.

8. The method of claim 6, wherein each of the N ADC units comprises:

a voltage-controller oscillator for receiving either the calibration signal or the input signal and outputting an oscillation signal in accordance with the associated control signal;

a phase-to-digital converter for receiving the oscillation signal and outputting a digitized phase signal;

a derivative operator for receiving the digitized phase signal and outputting the raw data; and a nonlinearity correction unit for receiving the raw data and outputting the refined data in accordance with the associated mapping table.

9. A method comprising:

dispatching a calibration signal to an analog-to-digital converter unit for performing analog-to-conversion on the calibration signal to obtain a raw data;

setting the calibration signal to a first level and performing an averaging on the raw data to obtain a first mean value;

setting the calibration signal to a second level and performing an averaging on the raw data to obtain a second mean value;

setting the calibration signal to a third level and performing an averaging on the raw data to obtain a third mean value;

setting the calibration signal to a fourth level and performing an averaging on the raw data to obtain a fourth mean value;

determining a first, a second, a third, and a fourth ideal value for the first, the second, the third, and the fourth mean value, respectively, for a hypothetical case where the analog-to-digital conversion is ideal; and applying a least mean square error algorithm to obtain a set of coefficients for mapping the first, the second, the third, and the fourth mean value into the first, the second, the third, and the fourth ideal value, respectively, to minimize a mean square error.

* * * * *